(12) United States Patent
Zhang et al.

(10) Patent No.: US 8,680,716 B2
(45) Date of Patent: Mar. 25, 2014

(54) SUPERCONDUCTING SWITCH OPERATION

(75) Inventors: Shaohai Zhang, Kidlington (GB); Alexander John Marshall, Oxford (GB); Antonis Chris Marshall, Abington (GB)

(73) Assignee: Agilent Technologies, Inc., Santa Clara, CA (US)

( * ) Notice: Subject to any disclaimer, the term of this patent is extended or adjusted under 35 U.S.C. 154(b) by 810 days.

(21) Appl. No.: 12/680,888

(22) PCT Filed: Oct. 7, 2008

(86) PCT No.: PCT/US2008/079092
§ 371 (c)(1),
(2), (4) Date: Mar. 30, 2010

(87) PCT Pub. No.: WO2009/048877
PCT Pub. Date: Apr. 16, 2009

(65) Prior Publication Data
US 2010/0213772 A1    Aug. 26, 2010

(30) Foreign Application Priority Data
Oct. 11, 2007    (GB) .................................. 0719843.5

(51) Int. Cl.
*H01H 47/00*    (2006.01)
(52) U.S. Cl.
USPC ........................................................ 307/115
(58) Field of Classification Search
USPC ........................................................ 307/115
See application file for complete search history.

(56) References Cited

U.S. PATENT DOCUMENTS

| | | |
|---|---|---|
| 6,624,734 B2 | 9/2003 | Lanoue et al. |
| 2005/0153843 A1 | 7/2005 | Kubota |

FOREIGN PATENT DOCUMENTS

| | | | |
|---|---|---|---|
| GB | 2422060 A | * | 7/2006 |
| GB | 2438446 A | * | 11/2007 |
| JP | 05121233 | | 5/1993 |
| JP | 08222428 | | 8/1996 |
| JP | 09051128 | | 2/1997 |
| JP | 2005197539 | | 7/2005 |
| JP | 200613316 | | 1/2006 |
| WO | WO2006072630 | | 7/2006 |

OTHER PUBLICATIONS

Office Action mailed Apr. 25, 2013 for Japanese Patent Application No. 2010-528974.

* cited by examiner

*Primary Examiner* — Rexford Barnie
*Assistant Examiner* — Dru Parries

(57) ABSTRACT

A method of operating a superconducting switch system to protect against quenching in a superconducting magnet circuit is provided. The system comprises a magnet circuit, a main superconducting switch and an auxiliary superconducting switch connected in parallel thereto by low resistance connecting parts. In an initial magnet energisation procedure, after establishing superconducting flow in the circuit, the main and auxiliary switches are closed to cause current to persist in the circuit without further power input. If the main switch quenches, the current will transfer to the auxiliary switch through the resistive connecting parts. Upon restoring the main switch to the superconducting state, the voltage drop through the resistive connecting parts will drive the current back through the main switch. A preconditioning procedure is carried out as part of the magnet energisation procedure to ensure that opening the main switch will establish superconducting current through the auxiliary switch.

13 Claims, 5 Drawing Sheets

SUPERCONDUCTING SWITCH OPERATION

CROSS REFERENCE TO RELATED APPLICATIONS

The subject patent application is claiming a priority of Great Britain Patent Application No. 0719843.5 filed in the Great Britain Patent Office on 11 Oct. 2007.

FIELD OF THE INVENTION

This invention relates to methods of operating superconducting switch systems and persistent mode superconducting magnet systems, and is concerned more particularly with the recovery of the quenching of a superconducting switch during superconducting magnet operation.

BACKGROUND OF THE INVENTION

Persistent mode superconducting magnets, used in nuclear magnetic resonance spectroscopy (NMR), magnet resonance imaging (MRI), electronic paramagnetic resonance (EPR) and Fourier transform mass spectroscopy (FTMS), incorporate a persistent switch, also referred to as a "main superconducting switch", which when closed permits the superconducting current flow within the magnet circuit to persist without any further injection of current into the circuit being required. The use of such a persistent switch serves to increase the stability of the superconducting magnet over long periods of time, and to reduce the amount of cryogenic liquid boil-off relative to the amount of boil-off that would take place in the event that current needed to be continually supplied to the magnet circuit.

A main superconducting switch typically comprises a short section of superconducting wire connected across the input terminals of the magnet and an integral heater for driving the superconducting wire into resistive mode when the switch is to be opened. When the heater is turned on and the superconducting wire becomes resistive, a voltage is built up across the magnet and the magnet can be energised (or de-energised). After such energisation from an external power supply, the heater is turned off, and the resistive superconducting wire is cooled down by a cryogenic liquid bath so that it again becomes superconductive. In this persistent superconducting mode, the external power supply can be turned off to reduce the heat input to the cryogenic liquid bath and the current will continue to circulate through the magnet circuit and the main superconducting switch.

The main superconducting switch may be caused to quench after a period of time of magnet operation, for example due to interference or magnet wire movement. If the main superconducting switch opens or quenches in this manner, the superconducting magnet current flow will lose its persistence and run down, or even cause the magnet to be quenched.

It might be thought that multiple superconducting switches connected in parallel would overcome this problem in that one of the switches would always be available to conduct the persistent current. However, it turns out that such an arrangement does not work effectively as a result of the fact that recirculating currents are generated within the superconducting switches, and also it becomes impossible to share currents between the two superconducting switches equally.

WO 2006/072630 discloses a superconducting switch system comprising a main superconducting switch, which carries the magnet operating current during normal operation of the circuit, and an auxiliary superconducting switch connected in parallel with the main superconducting switch. The auxiliary superconducting switch is resistively connected to the circuit through connecting parts preferably constituted by solder joints. Such a superconducting switch system is intended to provide a safeguard against unintentional quenching of the magnet such that, if the main superconducting switch quenches, the current will transfer to the auxiliary superconducting switch through the connecting parts. Subsequently, after the main superconducting switch has been re-cooled and has recovered to the superconducting state, the voltage drop through the resistive connecting parts will drive the current back to the main superconducting switch. However it has been found that it cannot always be guaranteed that, when the main superconducting switch quenches, the current will transfer to the auxiliary superconducting switch, and failure of the current to transfer to the auxiliary superconducting switch can have serious consequences in terms of causing the superconducting magnet current flow to lose its persistence and run down, or even causing the magnet to be quenched.

It is an object of the invention to provide a method of operating a superconducting switch for a persistent mode superconducting magnet system so as to substantially obviate this problem.

SUMMARY OF THE INVENTION

According to the present invention there is provided a method of operating a superconducting switch system for a persistent mode superconducting magnet system so as to condition the system against quenching of a superconducting magnetic circuit of the system. The method comprising the steps of connecting a main superconducting switch to the magnetic circuit by two connecting parts, the main superconducting switch providing a very low resistance of a first resistance value between the connecting parts; connecting an auxiliary superconducting switch to the magnetic circuit by the connecting parts, the auxiliary superconducting switch providing a low resistance of a second resistance value greater than the first resistance value between the connecting parts; energising the magnetic circuit by means of a power supply connected to the connecting parts; closing the main superconducting switch and the auxiliary superconducting switch so as to cause superconducting current flow through the main superconducting switch within the magnetic circuit and so as to cause the superconducting current flow to persist within the magnet circuit when the power supply is disconnected; carrying out a preconditioning step by opening the main superconducting switch and determining whether the superconducting current flow persists within the magnet circuit by flowing through the auxiliary superconducting switch; closing the main superconducting switch so as to cause the superconducting current flow to revert to flowing through the main superconducting switch as a result of the second resistance value being greater than the first resistance value; and where the determination in the preconditioning step indicates failure of the superconducting current flow to transfer from the main superconducting switch to the auxiliary superconducting switch, repeating the preconditioning step as many times as is necessary to condition the system against quenching.

In this manner the superconducting switch system is pre-trained so as to ensure that at all times during subsequent operation of the superconducting switch system it can be guaranteed that the superconducting current flow will transfer to the auxiliary superconducting switch in the event that the main superconducting switch is opened. It is thereby ensured that the main superconducting switch is protected from external or internal events or interference at all times by the use of one or more auxiliary superconducting switches connected to the main superconducting switch by low resistance connections (rather than superconducting connections). If an event takes place whereby the main superconducting switch opens, then the magnet current is captured by the auxiliary superconducting switch or switches and quenching of the magnet is avoided. If more than one auxiliary superconducting switch is used, the current in these switches is equally shared (in the dynamic and static senses) assuming that the resistance and inductance associated with each auxiliary superconducting switch is of the same value.

It is not known why such pretraining is necessary to ensure that the superconducting switch system is in the required working condition such that the magnet current is captured by the auxiliary superconducting switch if an event takes place that causes the main superconducting switch to open. However it has been observed that, in the absence of such pretraining, there have been occasions where, when an event has taken place causing the main superconducting switch to suddenly open, the magnet current has failed to transfer to the auxiliary superconducting switch and as a result the magnet has quenched. This can be a very costly result as the magnet would then have to be returned to the manufacture and conditioned all over again. It is accordingly considered necessary to apply a preconditioning procedure to all magnets after fabrication and before being put into permanent operation, according to which procedure the main superconducting switch is opened with the magnet running at full current and a check is carried out to see whether this has caused the current to be transferred to the auxiliary superconducting switch. The procedure often needs to be repeated if the current fails to transfer and the switch quenches. Only after such pretraining has been completed, with enough repetitions being performed to ensure that the switch system is in working condition, is the magnet put into permanent operation.

By using the approach of auxiliary superconducting switch or switches, the magnet current will only flow through the main superconducting switch during normal magnet operation, the main superconducting switch presenting no resistive joints to the magnet. In the event that the main superconducting switch opens due to external or internal disturbance, the magnet current will be diverted through the or each auxiliary superconducting switch as the resistance of the main superconducting switch increases to the order of a few ohms.

The resistance value of the auxiliary superconducting switch needs to be low enough so that the voltage drop across the main superconducting switch is low and therefore the power dissipation in the main superconducting switch is also low. The resistance associated with the auxiliary superconducting switch should be very low, for example of the order of $10^{-8}\Omega$. This allows the main superconducting switch to cool down and close, and the current to then transfer from the auxiliary superconducting switch to the main superconducting switch with a time constant equivalent to L/R seconds, where L is the overall inductance of the auxiliary superconducting switch and the main superconducting switch and R is the resistance of the auxiliary superconducting switch only. When the main superconducting switch opens and the current is diverted to the auxiliary superconducting switch, before eventually returning to the main superconducting switch, the loss of energy during the process is minimal (typically approximately 1 Joule).

BRIEF DESCRIPTION OF THE DRAWINGS

In order that the invention may be more fully understood, a number of embodiments of the invention will now be described, by way of example, with reference to the accompanying drawings, in which.

DETAILED DESCRIPTION OF THE INVENTION

Each of the superconducting switch systems to be described below incorporates, within a container maintained at a superconducting temperature, a main superconducting switch having a very low resistance of a first resistance value, and an auxiliary superconducting switch having a low resistance of a second resistance value (this resistance including the resistance of the resistive solder joints described below), the second resistance value being greater than the first resistance value so that the superconducting current will revert to flowing through the main superconducting switch when the main superconducting switch returns to the closed state as described in more detail below. Typically the second resistance value is of the order of $10^{-8}\Omega$, say $10^{-9}$-$10^{-7}\Omega$, whereas the first resistance value is of the order of $10^{-12}\Omega$.

Figure 1:
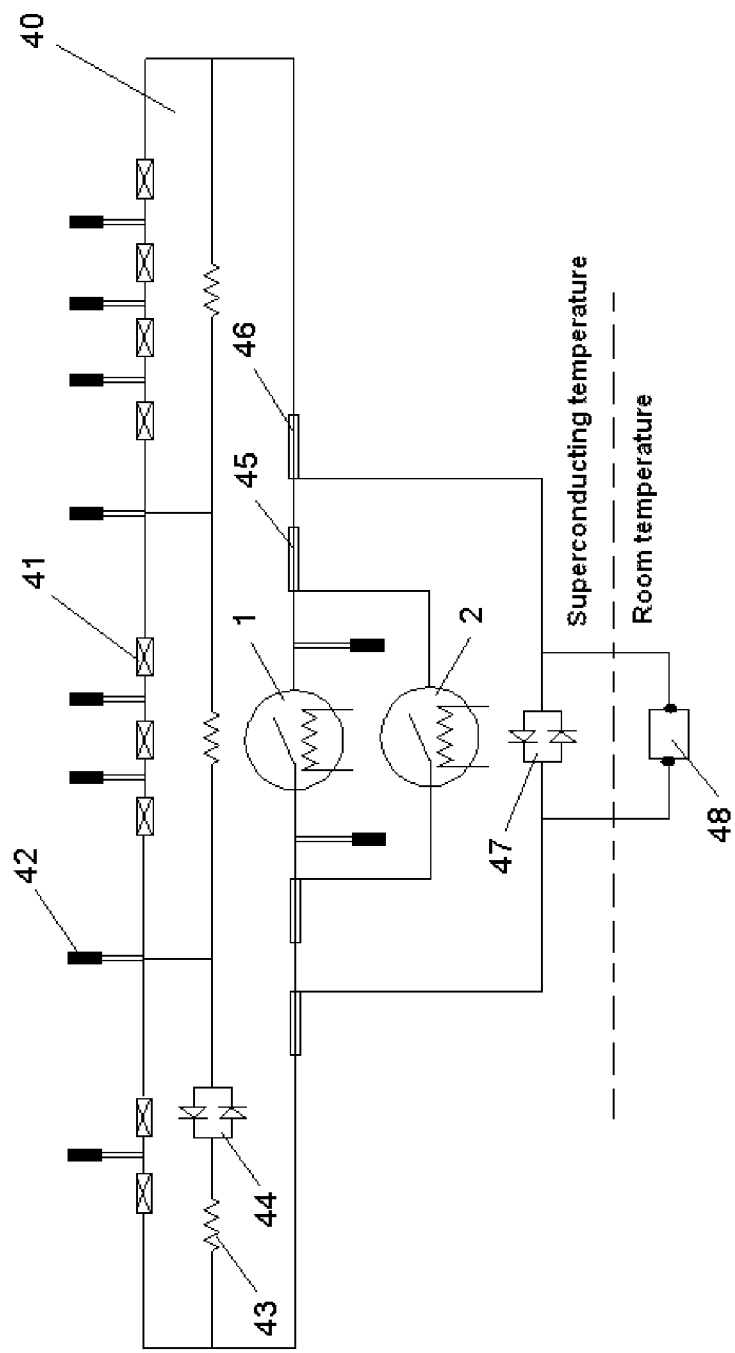
FIG. 1 is a diagram of a superconducting magnet circuit incorporating a superconducting switch system.

Referring to FIG. 1, a typical superconducting magnet circuit 40 comprises a number of magnet coils 41 serially connected together by superconducting joints 42 and having protection resistors 43 or a combination of resistors and diodes 44, connected in parallel therewith to protect the coils 41 in the event of the magnets quenching. A main superconducting switch 1 is connected to the circuit 40 by superconducting joints, and an auxiliary superconducting switch 2 is connected to the circuit 40 by resistive solder joints 45 in parallel with the main superconducting switch 1.

Diode protection circuitry 47 is connected by further resistive solder joints 46 in parallel with both the main superconducting switch 1 and the auxiliary superconducting switch 2 to safeguard the switches from damage, and power supply terminals for connection to an external power supply 48 at room temperature are connected in parallel with the diode protection circuitry 47. In normal operation, once appropriate current has been supplied to the circuit 40 by the power supply with the main superconducting switch 1 and auxiliary switch 2 in the open position, the main superconducting switch 1 and auxiliary switch 2 are closed in order to cause the current to persist in the circuit 40 without further power input. In this circuit the resistance value of the resistive solder joints 45 is of the order of $10^{-9}$-$10^{-7}\Omega$, the inductance of the switch assembly is of the order of $10^{-6}$-$10^{-4}$ H, the time constant of the switch assembly is of the order of 10-1000 seconds, and the energy loss of the magnet may be of the order of 1 Joule.

Figure 2:
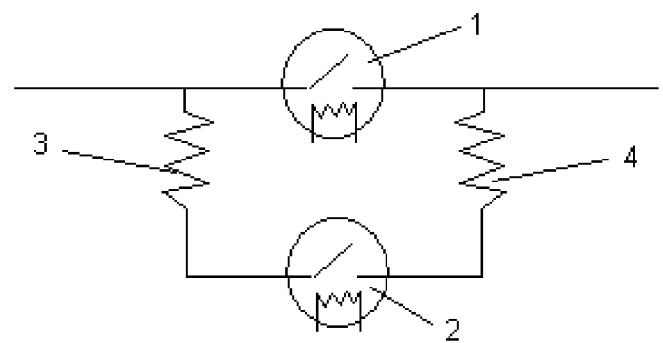
FIGS. 2 to 9 are diagrams of a number of alternative embodiments of the invention.

FIG. 2 shows a superconducting switch system comprising the main superconducting switch 1, which carries the magnet operating current during normal operation of the circuit, and the auxiliary superconducting switch 2 connected in parallel with the main superconducting switch 1, as already described above with reference to FIG. 1. The auxiliary superconducting switch 2 is resistively connected to the circuit through connecting parts 3 and 4 preferably constituted by solder joints as described above. The purpose of such a switch system is to ensure that, if the main superconducting switch 1 quenches due to external or internal disturbance, the current will transfer very quickly to the auxiliary superconducting switch 2 through the connecting parts 3 and 4. Subsequently, after the main superconducting switch 1 has been re-cooled and has recovered to the superconducting state, the voltage drop through the resistive connecting parts 3 and 4 will drive the current back to the main superconducting switch 1.

However the superconducting switches 1 and 2 are necessarily manufactured from superconducting wire that is not particularly stable when carrying current, and it has been found that, in the absence of pretraining, the magnet current may sometimes fail to transfer to the auxiliary superconducting switch 2 when an event has taken place that has caused the main superconducting switch 1 to suddenly open, and as a result the magnet may quench. It has accordingly been found necessary to apply a preconditioning procedure to all magnets after fabrication and before being put into permanent operation.

As mentioned above the superconducting switch system is energised by way of external current connections from the external power supply 48, using a procedure by which, in order to initially energise the system, the external current supply 48 is connected to the circuit and the switch heaters are turned on to open the superconducting switches 1 and 2. The current through the magnet then increases at a rate determined by the energisation voltage of the external current supply 48 and the inductance of the magnet. Once the correct current and field are reached in the magnet the current may be caused to persist by reducing the voltage of the external power supply 48 close to zero and then closing the two superconducting switches 1 and 2. In this manner the current through the external circuit is reduced to zero leaving the desired current and field persisting in the magnet.

According to the preconditioning procedure, which is carried out as part of the magnet energisation procedure referred to above, the superconducting switch system is pretrained by causing the main superconducting switch 1 to open by turning on of the associated switch heater (after closing of the two superconducting switches 1 and 2 to cause persistence of the superconducting current flow) with the magnet running at full current, and then checking to see whether this has caused the superconducting current to be transferred from the main superconducting switch 1 to the auxiliary superconducting switch 2. When the associated switch heater is turned on during this procedure the current should jump out of the main superconducting switch 1 and into the auxiliary superconducting switch 2. In the event that this does not happen, both superconducting switches 1 and 2 become open simultaneously and the current jumps back into the external circuit and through the external power supply 48. If this happens the external current is then again increased back to the desired current in the magnet, and the superconducting current flow is again caused to persist as described in the magnet energisation procedure above before a further preconditioning cycle is initiated by causing the main superconducting switch 1 to open by turning of the associated switch heater. The preconditioning step is repeated until the auxiliary superconducting switch 2 is shown to reliably carry the full magnet current when the main superconducting switch 1 is opened. It will be appreciated that the required preconditioning procedure may require several attempts until it has been shown that the current is able to jump reliably from the main superconducting switch 1 to the auxiliary superconducting switch 2. However, once the auxiliary superconducting switch 2 has been conditioned, the preconditioning procedure is stopped and the external current supply 48 can be disconnected leaving the superconducting current flow persisting in the magnet. Thereafter it can be safely assumed that the magnet current will transfer to the auxiliary superconducting switch 2 when an event takes place to cause the main superconducting switch 1 to suddenly open, thus preventing undesirable quenching of the magnet.

As will be appreciated from the above description the preconditioning procedure often needs to be repeated if the current fails to transfer to the auxiliary superconducting switch 2 and the switch quenches, until the superconducting switch system is fully trained. Only after such pretraining has been completed, with enough repetitions being performed to ensure that the superconducting switch system is in working condition, is the magnet put into permanent operation. This preconditioning procedure is essential to ensure that the superconducting switch system is in working condition ready to catch the superconducting magnet current if the main superconducting switch 1 accidentally opens. In the absence of such a preconditioning procedure it is very likely that the superconducting switch system would not actually work just at the moment that it was needed and the magnet would quench.

Figure 3:
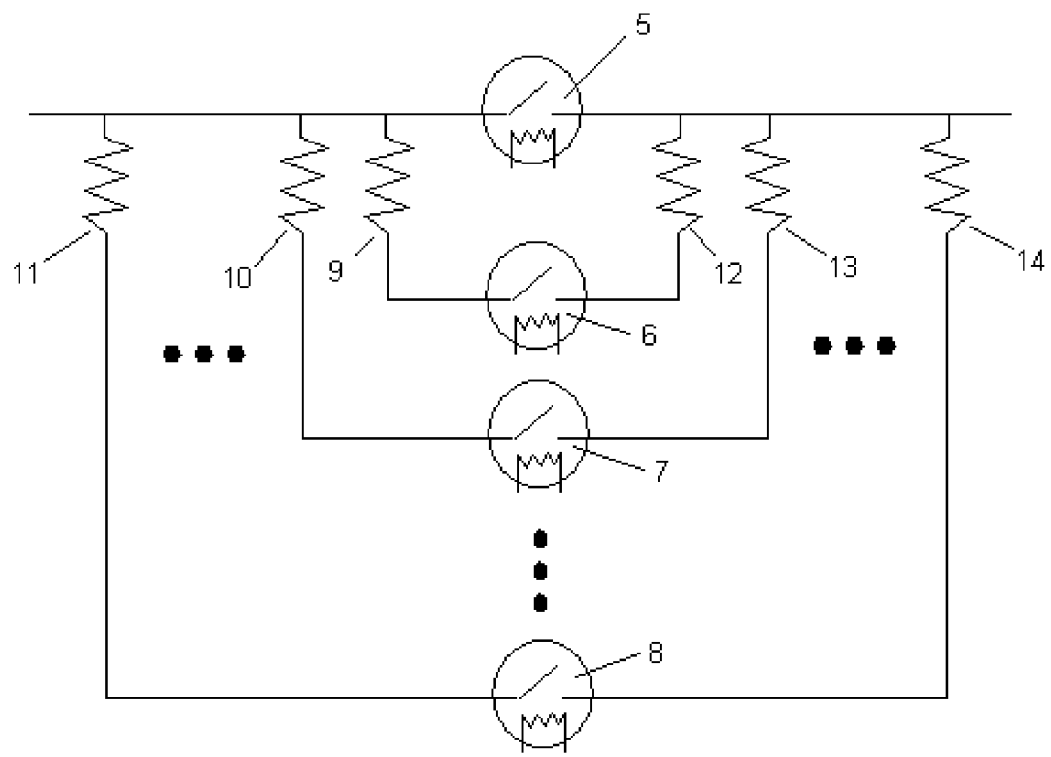

If the magnet operating current is high, it is not possible for a single auxiliary superconducting switch to handle the operating current when the main superconducting switch is opened, due to the high current rate of change from the main superconducting switch to the auxiliary superconducting switch. In this event then more than one auxiliary superconducting switch is required. FIG. 3 shows a second embodiment of superconducting switch system in which two or more auxiliary superconducting switches 6, 7, 8 are connected to the magnet circuit in parallel with the main superconducting switch 5, which carries the magnet operating current during normal operation of the magnet circuit, by resistive solder joints 9, 10, 11, 12, 13, 14. If the main superconducting switch 5 quenches (or opens), the current will transfer to the auxiliary superconducting switches 6, 7, 8 through the solder joints 9, 10, 11, 12, 13, 14. Subsequently, after the main superconducting switch 5 has recovered, the voltage across the solder joints 9, 10, 11, 12, 13, 14 will drive the current back to the main superconducting switch 5. As with the previous embodiment a preconditioning procedure is carried out as part of the magnet energisation procedure in order to ensure that the auxiliary superconducting switches 6, 7, 8 are in working condition ready to receive the current from the main superconducting switch 5.

Figure 4:
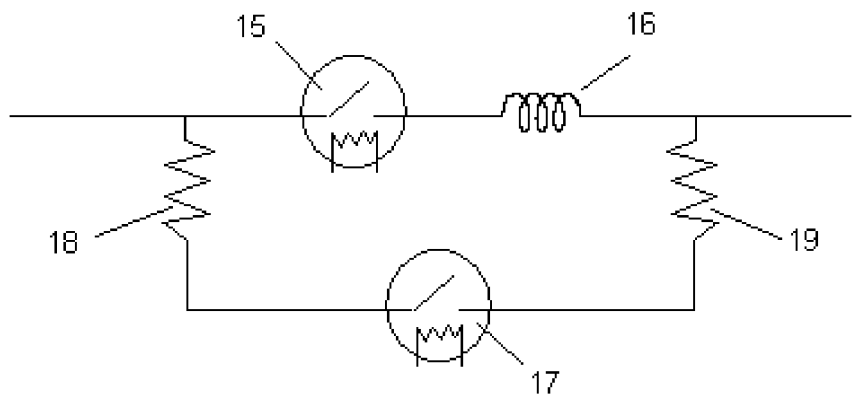

To reduce the current transfer rate from the main superconducting switch to the auxiliary superconducting switch, an inductor may be added to the magnet circuit. FIG. 4 shows a third embodiment in which an inductor 16 is serially connected between the main superconducting switch 15 and the auxiliary superconducting switch 17. The inductor 16 serves to reduce the current transfer rate from the main superconducting switch 15 to the auxiliary superconducting switch 17, which is resistively connected to the circuit through the connecting parts 18 and 19 generally constituted by solder joints. If the main superconducting switch 15 quenches, the current will transfer to the auxiliary superconducting switch 17 through the connecting parts 18 and 19. Subsequently, after the main superconducting switch 15 and the inductor 16 have recovered, the voltage across the connecting parts 18 and 19 will drive the current back to the main superconducting switch 15. The presence of the inductor 16 may increase the time constant to about 30 minutes, and the energy loss of the magnet may be of the order of 10 Joules. As with the previous embodiments a preconditioning procedure is carried out as part of the magnet energisation procedure in order to ensure that the auxiliary superconducting switch 17 is in working condition ready to receive the current from the main superconducting switch 5.

Figure 5:
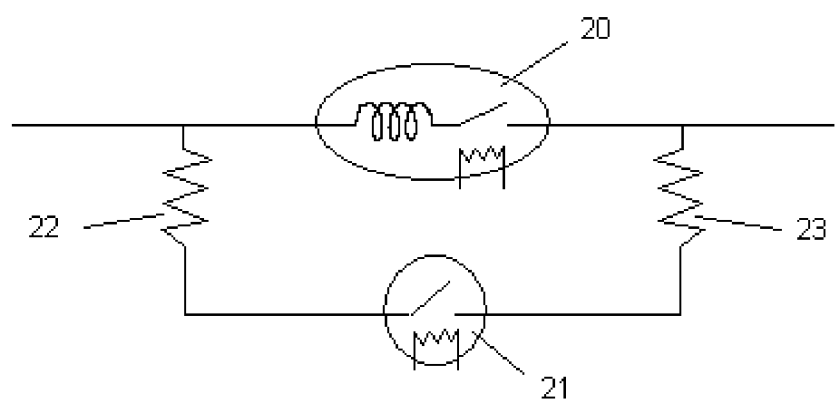

To reduce the number of components an inductively wound main superconducting switch 20 may be connected to the circuit, as in the fourth embodiment of FIG. 5, in place of the serially connected main superconducting switch 15 and the inductor 16 of FIG. 3. As in the third embodiment the auxiliary superconducting switch 21 is connected to the magnet circuit through the connecting parts 22 and 23 so that, if the main superconducting switch 20 quenches, the current will transfer to the auxiliary superconducting switch 21 through the connecting parts 22 and 23. A preconditioning procedure is carried out as part of the magnet energisation procedure.

Figure 6:
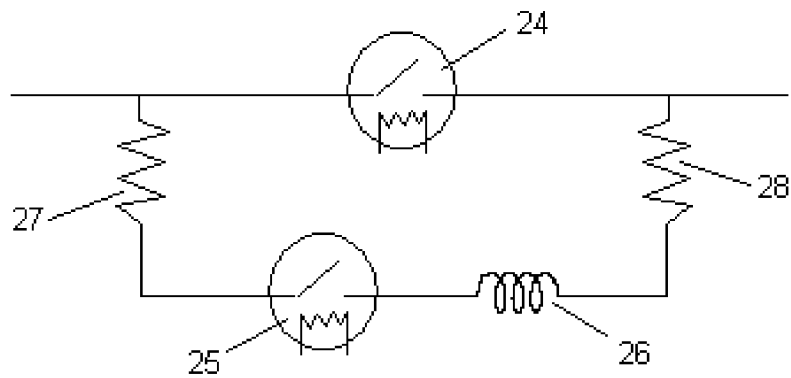

To reduce the current transfer rate from the main superconducting switch 24 to the auxiliary superconducting switch 25, an inductor 26 is serially connected between the auxiliary superconducting switch 25 and the magnet circuit in a fifth embodiment as shown in FIG. 6. As in the third embodiment the auxiliary superconducting switch 25 is connected to the magnet circuit through the connecting parts 27 and 28 so that, if the main superconducting switch 24 quenches, the current will transfer to the auxiliary superconducting switch 25 through the connecting parts 27 and 28. A preconditioning procedure is carried out as part of the magnet energisation procedure.

Figure 7:
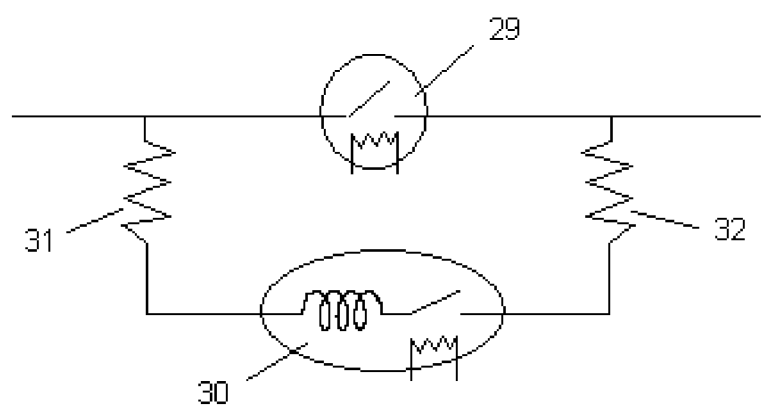

In a sixth embodiment as shown in FIG. 7, an inductively wound auxiliary superconducting switch 30 is provided in place of the serially connected main superconducting switch 15 and the inductor 16 of FIG. 3. As in the third embodiment the auxiliary superconducting switch 30 is connected to the magnet circuit through the connecting parts 31 and 32 so that, if the main superconducting switch 29 quenches, the current will transfer to the auxiliary superconducting switch 21 through the connecting parts 31 and 32. The inductively wound auxiliary superconducting switch 30 reduces the current transfer rate from the main superconducting switch 29 to the auxiliary superconducting switch 30. A preconditioning procedure is carried out as part of the magnet energisation procedure.

Figure 8:
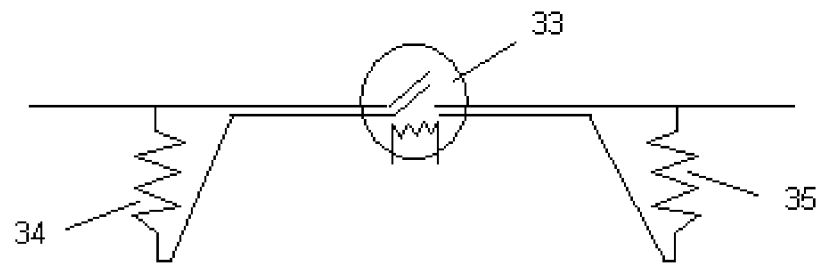

In a seventh embodiment as shown in FIG. 8, a multi-strand superconducting switch 33 is provided in place of both the main superconducting switch and the auxiliary superconducting switch. One portion of the strands of the switch 33 is connected by a superconducting joint to the magnet circuit to serve as the main superconducting switch, and the other portion of the strands of the switch 33 is resistively connected to the magnet circuit through connecting parts 34 and 35 to serve as the auxiliary superconducting switch so that, if the main superconducting switch quenches, the current will transfer to the auxiliary superconducting switch through the connecting parts 34 and 35. Subsequently, after the portion of the strands constituting the main superconducting switch has recovered, the voltage across the connecting parts 34 and 35 will drive the operating current back to the portion of the strands constituting the main superconducting switch. A preconditioning procedure is carried out as part of the magnet energisation procedure.

Figure 9:
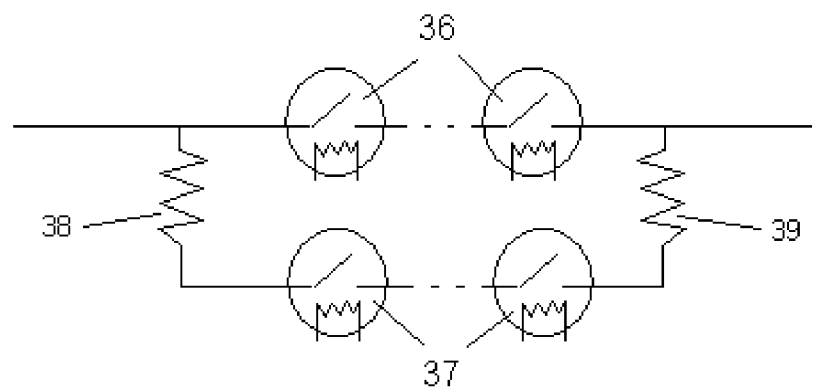

In an eighth embodiment as shown in FIG. 9, one or more main superconducting switches 36 are connected in series within the magnet circuit, and one or more series connected auxiliary superconducting switches 37 are connected to the magnet circuit in parallel with the main superconducting switch or switches 36 by means of resistive connecting parts 38 and 39. If the or each main superconducting switch 36 quenches, the current will transfer to the auxiliary superconducting switches 37 through the connecting parts 38 and 39. The provision of series connected auxiliary superconducting switches 37 has the advantage of increasing the total resistance in the normal state, thereby increasing the magnet ramp rate during energising or de-energising. A preconditioning procedure is carried out as part of the magnet energisation procedure.

In variant embodiments of the invention that are not illustrated, two or more main superconducting switches may be connected in parallel. Furthermore, in any of the embodiments described, the or each main superconducting switch may be single-strand or multi-strand wound. Also the or each auxiliary superconducting switch may be single-strand or multi-strand wound.

What is claimed is:

1. A method of operating a superconducting switch for a persistent mode superconducting magnet system so as to condition the system against quenching of a superconducting magnetic circuit of the system, the method comprising:
   connecting a main superconducting switch to the magnetic circuit by two connecting parts, the main superconducting switch providing a resistance of a first resistance value between the connecting parts;
   connecting an auxiliary superconducting switch to the magnetic circuit by the connecting parts, the auxiliary superconducting switch providing a resistance of a second resistance value greater than the first resistance value between the connecting parts;
   energising the magnetic circuit by means of a power supply connected to the connecting parts;
   closing the main superconducting switch and the auxiliary superconducting switch so as to cause superconducting current flow through the main superconducting switch within the magnetic circuit and so as to cause the superconducting current flow to persist within the magnet circuit when the power supply is disconnected;
   carrying out a preconditioning step by opening the main superconducting switch and determining whether the superconducting current flow persists within the magnet circuit by flowing through the auxiliary superconducting switch;
   closing the main superconducting switch so as to cause the superconducting current flow to revert to flowing through the main superconducting switch as a result of the second resistance value being greater than the first resistance value; and
   where the determination in the preconditioning step indicates failure of the superconducting current flow to transfer from the main superconducting switch to the auxiliary superconducting switch, repeating the preconditioning step as many times as is necessary to condition the system against quenching.

2. The method as claimed in claim 1, wherein a plurality of auxiliary superconducting switches are connected to the magnetic circuit in parallel between the connecting parts, each of the auxiliary superconducting switches providing a resistance of the second resistance value between the connecting parts when in a superconducting mode so that, when the main superconducting switch is in the open state, the superconducting current flows in parallel through the auxiliary superconducting switches, in order to decrease the risk of the magnet running down in the event of high current operation.

3. The method as claimed in claim 1, wherein a plurality of main superconducting switches are connected to the magnetic circuit in parallel between the connecting parts, each of the main superconducting switches providing a resistance of the first resistance value between the connecting parts when in a superconducting mode so that the superconducting current flows in parallel through the main superconducting switches when in the closed state.

4. The method as claimed in claim 1, wherein an inductor is connected in series with the or each main superconducting switch between the connecting parts, in order to slow down the current rate of change when the superconducting current flow changes to the or each auxiliary superconducting switch.

5. The method as claimed in claim 1, wherein the or each main superconducting switch is an inductive wound superconducting switch.

6. The method as claimed in claim 1, wherein an inductor is connected in series with the or each auxiliary superconducting switch between the connecting parts, in order to slow down the current rate of change when the superconducting current flow changes to the or each auxiliary superconducting switch and prevent the or each auxiliary superconducting switch from opening.

7. The method as claimed in claim 1, wherein the or each auxiliary superconducting switch is an inductive wound superconducting switch.

8. The method as claimed in claim 1, wherein the or each main superconducting switch is a single-strand or multi-strand wound.

9. The method as claimed in claim 1, wherein the or each auxiliary superconducting switch is a single-strand or multi-strand wound.

10. The method as claimed in claim 1, wherein the or each main superconducting switch is combined with an associated auxiliary superconducting switch in a single multi-strand wound switch component having one strand portion serving as the main superconducting switch and another strand portion serving as the auxiliary superconducting switch.

11. The method as claimed in claim 1, wherein the or each auxiliary superconducting switch is connected between the connecting parts by connecting means providing the resistance of the second resistance value.

12. The method as claimed in claim 11, wherein the connecting means comprise solder connections.

13. The method as claimed in claim 1, wherein one or more main superconducting switches are connected in series between the connecting parts, and a plurality of auxiliary superconducting switches are connected in series between the connecting parts.

* * * * *